United States Patent [19]

Kawahara et al.

[11] Patent Number: 5,337,271

[45] Date of Patent: Aug. 9, 1994

[54] SEMICONDUCTOR STORAGE DEVICE CAPABLE OF REDUCED CURRENT CONSUMPTION USING A CHARGE REUSE CIRCUIT

[75] Inventors: Takayuki Kawahara, Hachioji; Yoshiki Kawajiri, Akishima; Takesada Akiba, Tachikawa; Mssashi Horiguchi, Kawasaki; Goro Kitsukawa, Tokyo; Masakazu Aoki, Tokorozawa, all of Japan

[73] Assignees: Hitachi, Ltd., Tokyo; Hitachi Device Engineering Co., Ltd., Mobara, both of Japan

[21] Appl. No.: 974,925

[22] Filed: Nov. 12, 1992

[30] Foreign Application Priority Data

Nov. 12, 1991 [JP] Japan .................. 3-295477

[51] Int. Cl.$^5$ .................................. G11C 11/24
[52] U.S. Cl. .......................... 365/149; 365/207; 365/203; 365/208
[58] Field of Search ............ 365/149, 203, 207, 208, 365/189.01

[56] References Cited

U.S. PATENT DOCUMENTS 4,780,852 10/1988 Kajigaya et al. .................. 365/203

FOREIGN PATENT DOCUMENTS 60-45997 3/1985 Japan .

OTHER PUBLICATIONS

Hidaka et al., "A High-Density Dual-Port Memory Cell Operation for VLSI Drams", 1991 Symposium on VLSI Circuits, pp. 65–66.

Primary Examiner—Eugene R. LaRoche
Assistant Examiner—Huan Hoang
Attorney, Agent, or Firm—Antonelli, Terry, Stout & Kraus

[57] ABSTRACT

A semiconductor storage device is provided which minimizes current consumption by using a circuit which is fed by charges stored in a parasitic capacitance of another circuit. To this end, short-circuiting switches SP and SN are provided respectively between first common source lines PP1 and PN1 and second common source lines PP2 and PN2 of the semiconductor device. Electric charges on the first common source lines which have been amplified to its normal amplitude change the voltage level of the second common source lines. A data line connected to the second common source line is amplified to half of the normal amplitude. Thereafter, the signal on the data line is amplified by a sense amplifier. As a result, the charge and discharge currents on the data line are substantially halved compared to the conventional device.

12 Claims, 11 Drawing Sheets

F I G. 10
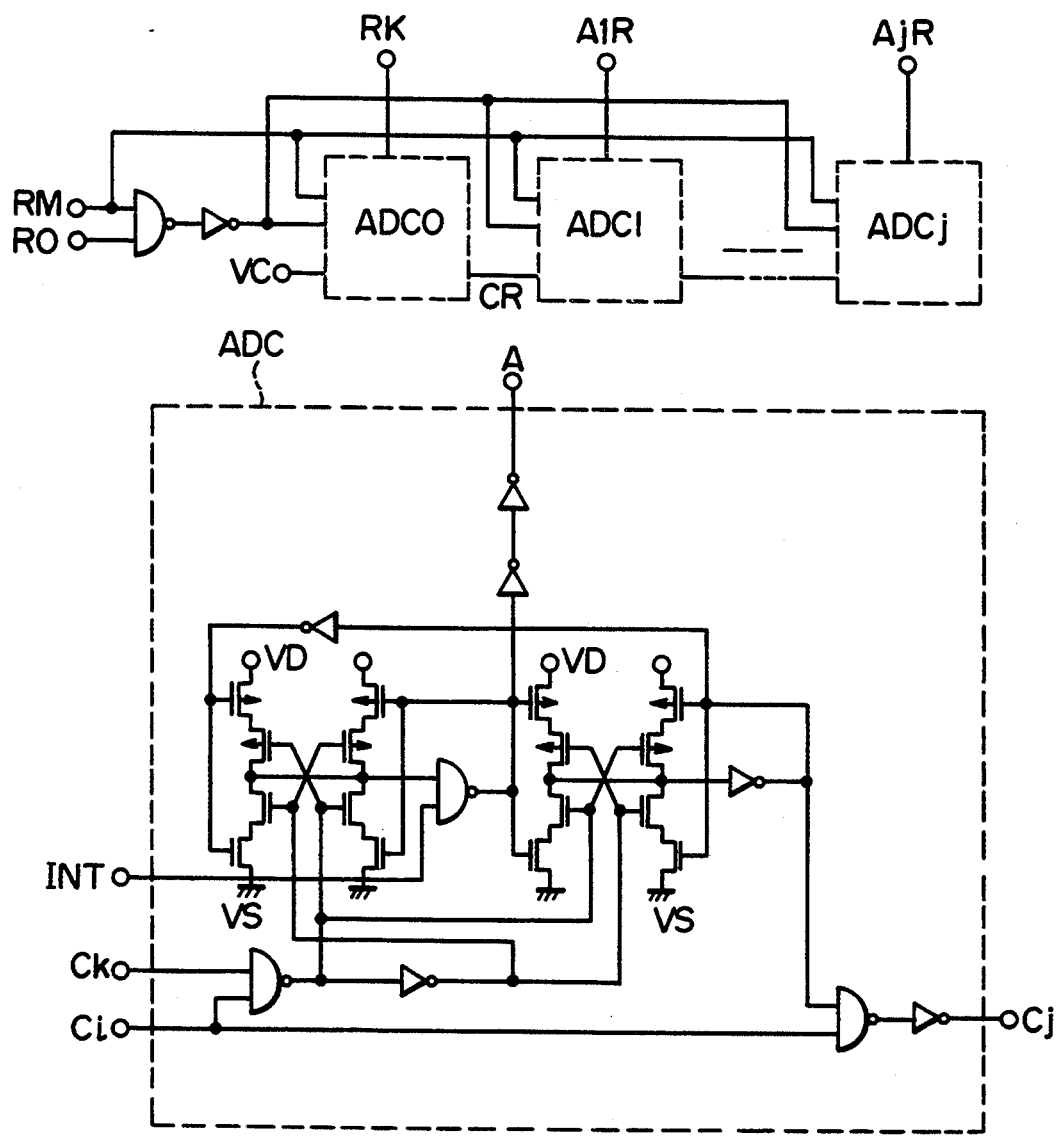

SEMICONDUCTOR STORAGE DEVICE CAPABLE OF REDUCED CURRENT CONSUMPTION USING A CHARGE REUSE CIRCUIT

BACKGROUND OF THE INVENTION

The present invention relates to semiconductor storage devices.

Reference characters representing terminal names also denote the names of leads and signals and, in the case of a power supply, its voltage value so long as they are not especially noted otherwise.

A conventional dynamic random access memory (DRAM) has a structure shown in FIG. 13.

A memory cell MC of one transistor and one capacitor is disposed at each of cross points where word lines W1-W4 and data lines D1-$\overline{D2}$ cross.

RA1 and RA2 each denote a sense amplifier which reads outs and rewrites a signal from and into the memory cell and which is driven by common sources PN and PP.

A common source signal is generated by a PC0 which short-circuits and precharges common sources PP and PN to a voltage level HV, a pMOS transistor DP1 which charges the common source PP to a high voltage VD and an nMOS transistor DN1 which charges the common source PN to a low voltage VS.

The drive signal for the DP1 is identified by RP while the drive signal for the DN1 is identified by RN.

PC1 and PC2 each denote a circuit which short-circuits and precharges the pair of data lines to HV.

DA1 and DA2 each denote a circuit which transfers a signal appearing on the pair of data lines to the later circuit, and also which transfers from the later stage a signal to be written into a memory cell through the pair of data lines.

A pair of I/O and $\overline{I/O}$ are inputs/outputs for DA1 and DA2, which control the transfer of a signal from the pair of data lines to a later stage circuit using YS1 and YS2.

In such a DRAM, the electric charges stored in a memory cell would normally become lost as various leak currents.

Therefore, the same data must be rewritten into the memory cell at constant intervals of time.

This operation is called a refreshing operation, which will be described with reference to FIG. 14.

A clock signal CK used for control of this operation is provided as an external clock signal such as $\overline{RAS}$ or generated internally by an oscillator.

In an initial state, the CK is at low level, RP is at high level, and RN is at low level. Therefore, the DP1 and DN1 are off.

Since FP is at high level VD, the pair of data lines and common sources PP and PN are short-circuited and hence are at a voltage level HV.

YS1 and YS2 are at low level and DA1 and DA2 are off.

In the refreshing operation, YS1 and YS2 are at low level throughout.

The word line is at VS.

If CK changes from low level to high level, first, FP changes to low level VS.

As a result, the pair of data lines and common sources PN and PP float at a level of HV. Thus, word line W1 is selected to change to high level VCH.

Therefore, a small voltage difference which corresponds to data from a memory cell occurs between the pair of data lines D1 and $\overline{D1}$.

RP and RN are then inverted.

Therefore, DN1 is turned on and common source PN is discharged toward VS. DP1 is turned on so that common source PP is charged toward YD. Thus, sense amplifiers RA1 and RA2 operate, so that the small voltage signal difference is amplified on the pair of data lines to a large amplitude VD-VS. When amplification ends, the word line changes to low level VS, RP and RN are inverted, and DP1 and DN1 are turned off.

Thereafter, FP changes to high level VD and the pair of data lines and common sources PN and PP are short-circuited to HV. This is the refreshing operation in the conventional DRAM.

When data in the DRAM is to be held by backup of a battery, a so-called standby source current is mainly determined by the refreshing current.

How to reduce the refreshing current is important to suppress the consumed current.

The memory cells are sequentially refreshed in the standby state.

The refreshing current is composed of the operating current in the refreshing control circuit and the data line charge and discharge currents.

In order to reduce the current flowing through the refreshing control circuit, a study of minimizing the number of elements of the circuits has been made. A Japanese Patent Publication JP-60-45997 discloses suppression of the charge and discharge currents on the data lines by reducing the voltage supplied to the refreshing control circuit in a standby state or increasing the refreshing period.

However, this publication only discloses how to suppress the consumed current from the side of the power supply and does not at all refer to an effective use of the current in the circuit.

SUMMARY OF THE INVENTION

The present invention is intended to reduce the consumed current in a semiconductor storage device.

It is an object of the present invention to provide a semiconductor storage device in which the consumed current is reduced by using in a circuit in the device the current fed from a power source to another circuit.

To this end, as shown in FIG. 1, a semiconductor storage device according to an aspect of the present invention is provided with a first memory cell MC, a first pair of data lines D1n, $\overline{D1n}$ to which the first memory cell MC is connected; a first sense amplifier RA1n which amplifies a small signal read out onto the first pair of lines D1n, $\overline{D1n}$; a second memory cell MC; a second pair of data lines D2n, $\overline{D2n}$ to which the second memory cell MC is connected; a second sense amplifier RA2n which amplifies the small signal read out onto the second pair of data lines D2n, $\overline{D2n}$; a first drive signal line PP1 which drives the first sense amplifier RA1n; a first switch DP11 which connects the first drive signal line PP1 and power source line VD; a second drive signal line PP2 which drives the second sense amplifier RA2n; a second switch DP21 which connects the second drive signal line PP2 and the power source line VD; and a third switch means SP which connects the first and second drive signal lines PP1 and PP2.

As a result, electric charges stored on the first drive signal line PP1 flow through the third switch means SP to the second drive signal line PP2.

An electric current which flows through the second drive signal line PP2 is suppressed by the quantity of electric charges which flow when a voltage is applied to the second drive signal line PP2. That is, the electric charges stored on the first drive signal line PP1, which are conventionally discarded by the short-circuits PC10, PC20, are caused instead to flow through the second drive signal line PP2 for re-using purposes.

Thus the consumed current is reduced compared to the conventional device.

BRIEF DESCRIPTION OF THE DRAWINGS

FIG. 10 shows a second illustrative control circuit.

DESCRIPTION OF THE PREFERRED EMBODIMENTS

First Embodiment

Figure 1:
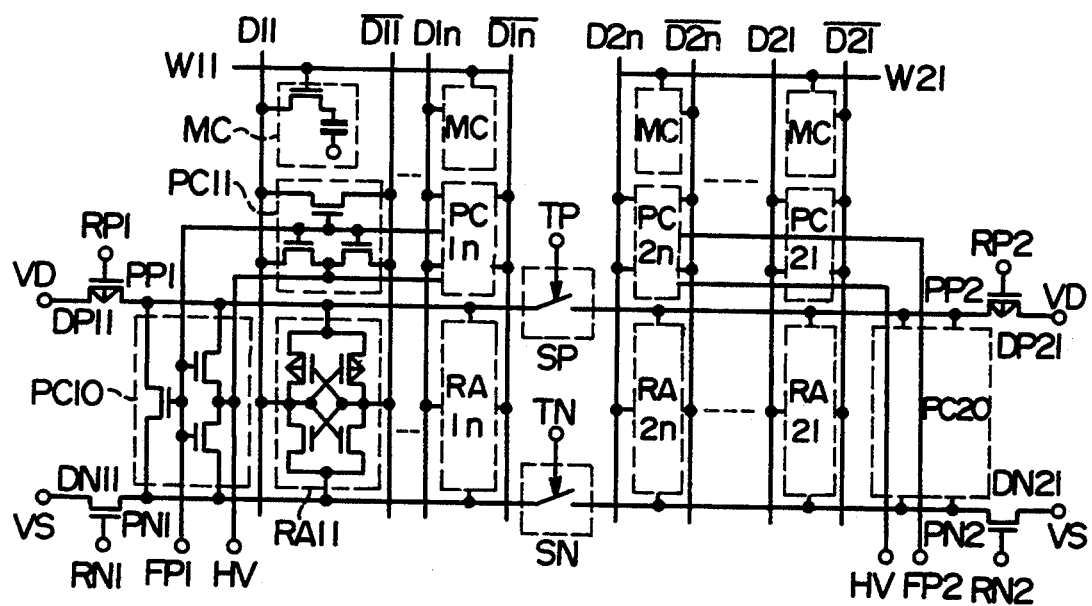
FIG. 1 shows a first embodiment of the present invention.
Figure 13:
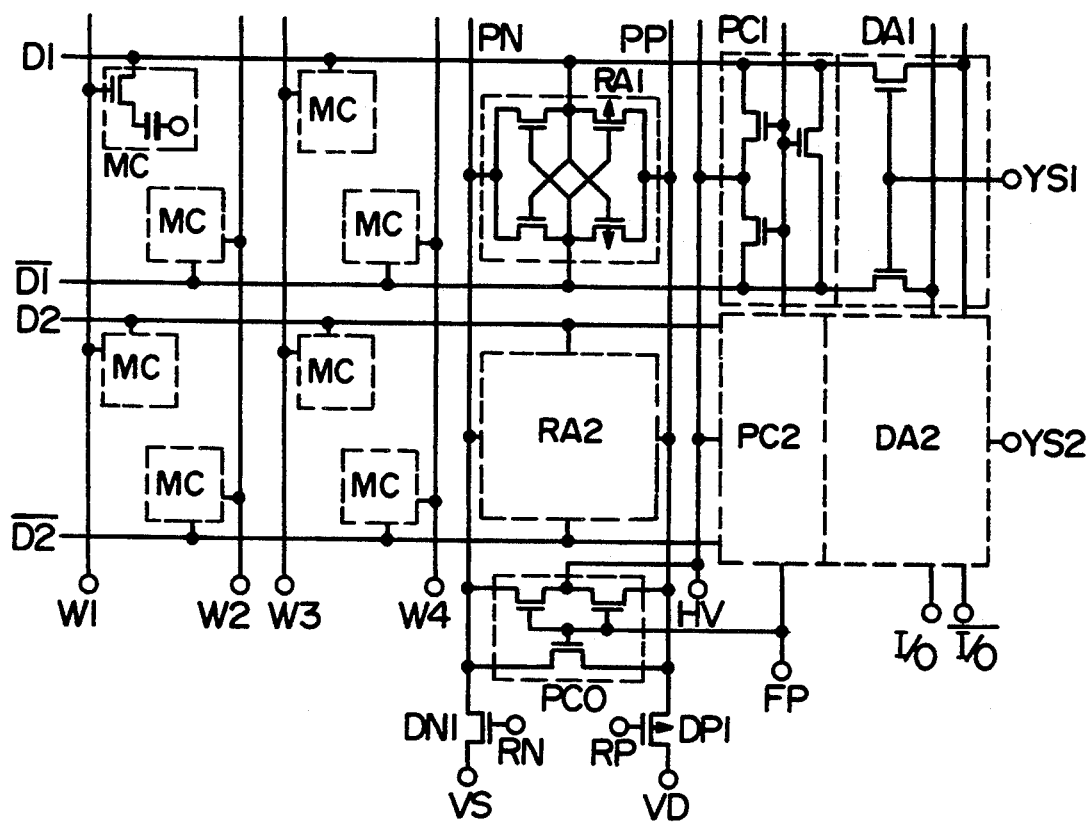
FIG. 13 shows a conventional example.

FIG. 1 shows a first embodiment of the present invention. In FIGS. 1 and 13, like reference numerals denote like elements. The embodiment of FIG. 1 differs from the example of FIG. 13 only in that the first embodiment includes two common sources PP (PP1 and PP2) connected by a switch SP and PN (PN1 and PN2) and connected by a switch SN.

Control terminals for the switches SP and SN are identified by TP and TN, respectively.

MC denotes a memory cell; W11 and W21 each denote a word line. Each pair of D11, $\overline{D11}$; . . . D2n, $\overline{D2n}$ denotes a pair of data lines.

PC10-PC2n each denote a short-circuit; RA11-RA2n each denote a sense amplifier.

DP11 denotes a pMOS transistor which charges PP1 to VD.

DP11 has a control terminal RP1.

DP21 denotes a pMOS transistor which charges PP2 to VD.

DP21 has a control terminal RP2.

DN11 denotes an nNOS transistor which discharges PN1 to VS.

DN11 has a control terminal RN1.

DN21 denotes an nNOS transistor which discharges PN2 to VS.

DN21 has a control terminal RN2.

The present invention does not restrict the structure of the memory cell, the intersections of the data lines and common source lines, etc.

Figure 2:
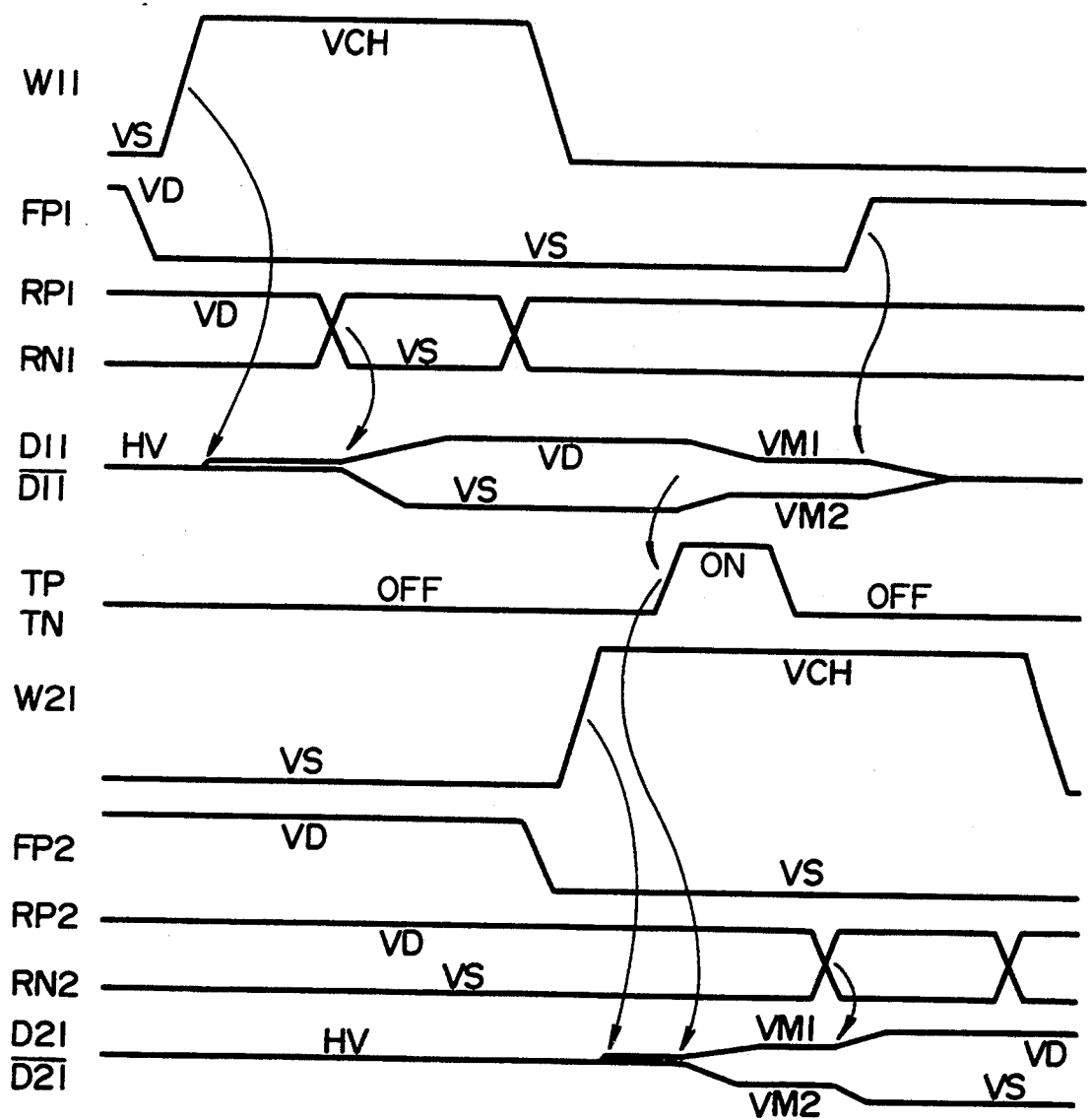
FIG. 2 illustrates the operation of the first embodiment.

The operation of this circuit will be described below with reference to FIG. 2.

In the following description, high voltage levels are all denoted by VD except for high voltage level VCH at the word lines.

All the voltage levels denoted by VD are not necessarily be the same voltage level.

The word lines W11 and W21 are at low voltage level VS in their initial state.

Since RP1 and RP2 are at VD and RN1 and RN2 are at VS, DP11 and DN21 are off.

Since FP1 and FP2 are at VD, PC10-PC2n are on.

As a result, the data lines D11-$\overline{D21}$ and PP1-PN2 are precharged to HV.

First, when FP1 changes to low level VS, the short circuits PC10, PC11 and PC1n which are connected to FP1 are turned off.

Therefore, the PP1 and PN1 and the data lines D11-D1n float at a voltage level of HV.

Thereafter, when the word line W11 changes to high level VCH, the transistor in the memory cell MC is turned on to thereby generate a small voltage on the data lines.

This small voltage is amplified when the RP1 and RN1 are inverted.

This operation is the same as that in the conventional example.

Even if the TP and TN are turned on temporarily before the RP1 and RN1 are inverted, there are no changes in the voltage of the PP1 and PN1.

Therefore, the TP and TN may be turned on to ensure that the operation is the same as an operation to be described later in more detail.

The pair of data lines D11 and $\overline{D11}$ change to VD and VS, respectively, in accordance with a read signal.

Thereafter, the word line W11 changes to low level.

The RP1 and RN1 are inverted.

As a result, the PP1 and PN1 float at the voltage levels of the VD and VS, respectively.

First, in the next cycle, the FP2 changes to low level VS and the short circuit which is connected to the FP2 is turned off.

As a result, the PP2 and PN2 and data lines D21-D2n float at the voltage level of HV.

The word line W21 changes to high level VCH to thereby turn on the transistor in the memory cell MC.

As a result, a small voltage corresponding to a signal in the memory cell occurs on the pair of data lines D21 and $\overline{D21}$.

After this small signal occurs, the switches SP and SN are turned on by TP and TN, respectively.

The PP1 and PP2, and PN1 and PN2 are each short-circuited. The electric charges on the PP1 at VD and the data lines connected electrically to the PP1 flow into the PP2 at HV.

By these electric charges, the pMOS transistor of the sense amplifier connected to the PP2 is operated.

Similarly, the electric charges on the PN2 at HV flow from the PN2 to the PN1 at VS and the data line connected electrically to the PN1.

By the flow of the electric charges from the PN2, the nMOS transistor of the sense amplifier connected to the PN2 operates. Thus, the small signals on the data lines D21-D2n are amplified.

If the PP and the PN have the same number of data lines, their total capacities are the same, so that small signals on the data lines D21–D2n are amplified to half of the proper amplitude.

That is, the high, level of the data line is amplified to a level of VM1 which is half of VD+HV.

The low level of the data line is amplified to a level of VM2 which is half of VS+HV.

Therefore, the voltage levels of the D11 and $\overline{D11}$ are amplified similarly to VM1 or VM2.

Thereafter, the TP and TN are inverted to turn off switches SP and SN.

Next, the RP2 and RN2 are inverted and power is supplied through the DP21 and DN21 to the PP2 and PN2, respectively.

At this time, the voltage amplitudes of the PP2 and PN2 are already amplified to half of their proper amplitude.

Therefore, the amounts of electric charges fed through the DP21 and DN21 from the power supply terminals VD and VS may be half of the amounts of charges usually supplied.

The voltage amplitudes of the PP2 and PN2 are already amplified to half of their proper amplitude, so that the electric current flowing through the sense amplifier is small.

The D11 and $\overline{D11}$ where their amplitude has become half of their proper one are short-circuited because the FP1 changes to high level VD to thereby turn on the short-circuit the PC11.

That is, a quantity of electric charges discarded due to the short-circuiting is half of the electric charges discarded in the conventional example.

The RP2 and RN2 are turned off and the PP2 and PN2 float at the voltage levels VD and VS, respectively, in the D21 and $\overline{D21}$ which has recovered their proper amplitude.

The word line W21 changes to low level VS and the transistor in the memory cell is turned off.

This situation is not shown. If the W11 is selected and a small signal is read out from the D11 and $\overline{D11}$, a similar operation will be performed by turning on the switches SP and SN again.

Next, charges on the PP2 and PN2 and the data lines connected to the PP2 and PN2 are amplified on the D11 and $\overline{D11}$ to half of the proper amplitudes.

By repeating such operations, according to the present invention, the charging currents flowing through the data lines are reduced to half of the conventional ones.

Second Embodiment

Figure 3:
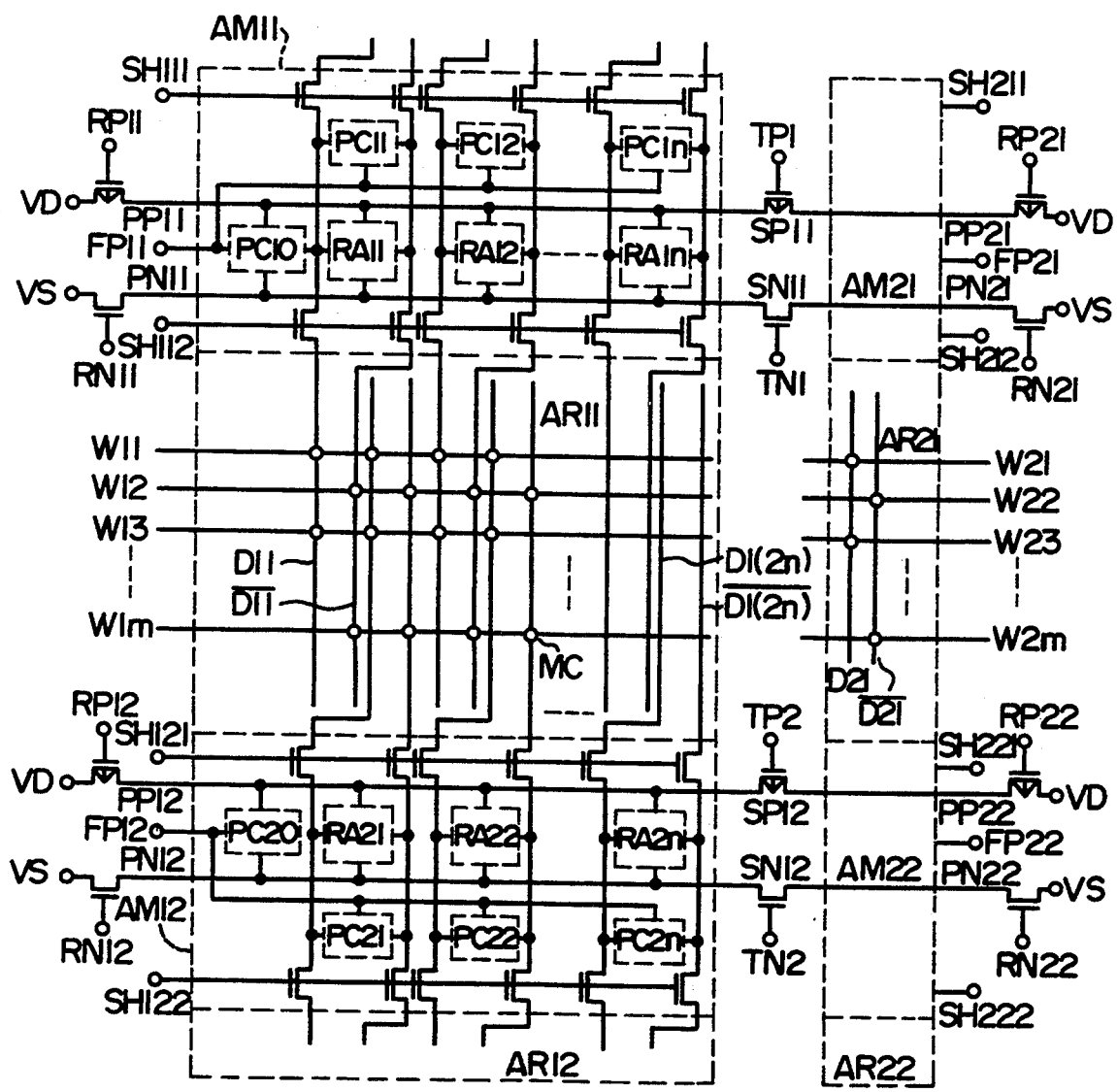
FIG. 3 shows a second embodiment of the present invention.

FIG. 3 shows a second embodiment of the present invention which is more specifically illustrated.

In the present embodiment, an operation similar to that mentioned above is performed by connecting the PP and PN corresponding to sets of memory cell arrays AR11, AR12 and AR21, AR22 through switches.

AM11–AM22 denote circuits each including a sense amplifier and a short-circuit.

The AM11–AM22 are each shared by the two arrays. For example, AM12 is shared by AR11 and AR12. The nMOS transistors which are controlled by SH121–SH122 determine which of the arrays the respective AM11–AM22 should be electrically connected to.

By such construction, the AM11–AM22 are laid out at a pitch wider than the pitch at which the memory cells are laid out.

The switch SP11 which connects the PP11 and PP21 is composed of a pMOS transistor.

Similarly, SN11 denotes a switch which connects PN11 and PN21 each composed of an nMOS transistor.

SP12 denotes a switch composed of a pMOS transistor which connects the PP12 and PP22.

SN12 denotes a switch composed of an nMOS transistor which connects the PN12 and PN22.

The operation of this device will be described with reference to FIG. 4.

CK denotes a clock signal which controls the operation of the circuit of this embodiment. As an example, the case in which AR11 and AR21 are selected alternately will be described.

To this end, SH112, SH121, SH212, SH222 are at high level at all times, and nMOS transistors connected to these elements are on at all times.

SH111, SH122 and SH211, SH222 change to low level VS in accordance with operation to thereby isolate unselected memory cell arrays electrically.

When CK changes from low to high level, first, SH111 and SH122 change to low level VS.

As a result, AM11 and AM12 are connected electrically to the memory cell array AR11 alone.

The FP11 and FP12 change from high level VD to low level VS to thereby release the short-circuiting and precharging of the data lines and PP11–PN12.

Thereafter, the word line W11 is selected to change to high level VCH and a small signal occurs on the data lines D11 and $\overline{D11}$.

At this time, TP1, TP2, TN1 and TN2 are inverted and PP11 and PP21, PP12 and PP22, and PN11 and PN21, and PN12 and PN22 are short-circuited, but they are at the same voltage level, so that there occur no changes.

After the TP1–TN2 are again inverted, the RP11 and RP12 change high level VD to low level VS and the RN11 and RN12 change from low level VS to high level VD.

This causes the sense amplifiers RA11–RA2n to operate thereby amplify the small signals on the data lines.

When this amplification is ended, the RP11, RP12 and RN11, RN12 are inverted.

The PP11, PP12 and PN11, PN12 are placed in a floating state.

The word line W11 changes to low level VS.

In the next cycle of the clock CK, the word line W21 is selected and a small signal is produced on the data lines D21 and D21.

Thereafter, the TP1, TP2 and the TN1, TN2 are inverted, so that the PP11, PP21; PP12, PP22; PN11, PN21; and PN12, PN22 are short-circuited.

Thus, as described with reference to FIGS. 1 and 2, the signal on the pair of data lines is amplified to half of its proper amplitude.

Thereafter, the RP11, RP12 and the RN11, RN12 are inverted and the pair of data lines is amplified to the amplitude VD−VS.

Thereafter, the FP11 and FP12 change to high level and the D11 and $\overline{D11}$ are short-circuited.

The subsequent operation is a repetition of the above operations, so that its further description will be omitted.

As described above, according to the present invention, the charging and discharging currents on the data lines are reduced to half of those on the data lines in the conventional device.

In the present invention, the PPs and PNs in the two systems are short-circuited to thereby amplify the currents on the data lines to half of their proper ones.

Figure 5:
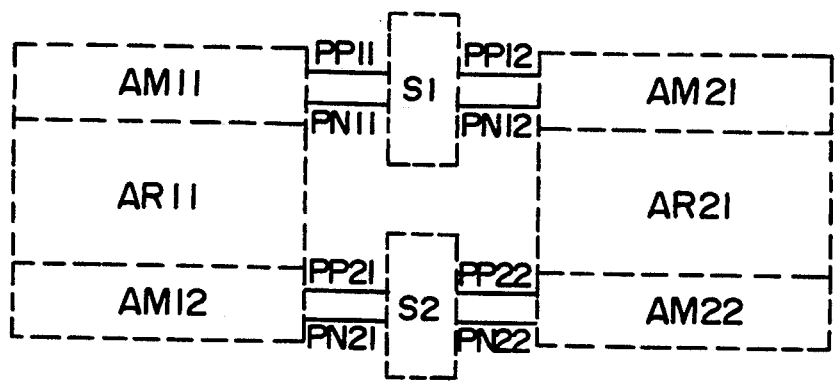
FIG. 5 shows the structure of a DRAM in which the present invention is applied.
Figure 6:
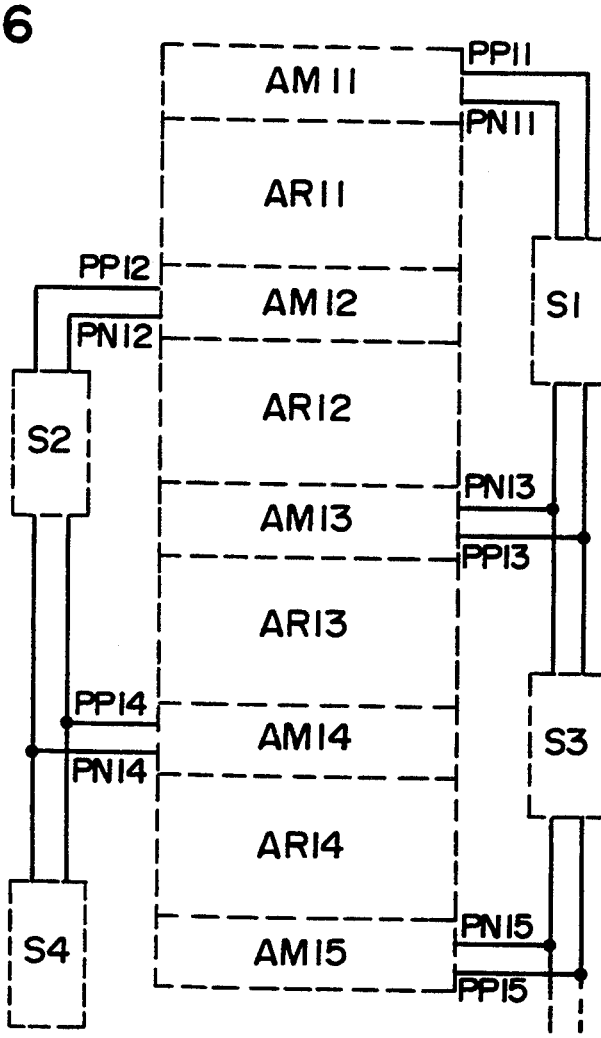
FIG. 6 shows a first layout.

FIGS. 5 and 6 show a layout for two systems which perform short-circuiting operations.

FIG. 5 shows a layout in which switches S1 and S2 are disposed between memory cell arrays AR11 and AR21 and between AM11 and AM21 and between AM12 and AM22, each AM being provided with a sense amplifier and a short-circuit.

FIG. 6 shows a layout in which AR11–AR14 and AM11–AM15 are arranged alternately in a single array and switching circuits S1–S4 are arranged alternately on each side of the array.

While in FIG. 6, the switching circuits S1, S3 and S2, S4 are disposed on the opposite sides of the memory cell array, they may be disposed on the same side.

The layout of FIG. 5 is smaller in the number of connections to the switching circuits S1 and S2 than the layout of FIG. 6.

If the distance between the AR11 and AR21 is too large or if bonding pads are disposed at the position of the switching circuits, so that layout is difficult, the layout of FIG. 6 is more preferable.

The operation of the device due to the layout of FIG. 5 is the same as that of the embodiment of FIG. 3.

The operation of the device of FIG. 6 is essentially the same as that of FIG. 5. First, the AR11 is selected to operate the AM11 and AM12, and the AR13 is then selected to operate the AM12 and AM14.

At this time, the switches S1 and S2 are used to electrically connect the PP11, PN11 to PP13, PN13 and the PP12, PN12 to the PP14, PN14.

Thus, the operation as mentioned above is performed.

In the layout of FIG. 6, the memory cell arrays are required to be selected alternately, as just described above.

Either of these methods exhibits the advantages of the present invention.

While the above embodiment illustrates that the PP and PNs in the two systems are short-circuited to thereby amplify the signals on the data lines to half of their proper amplitudes, this concept is applicable to four systems.

At this time, six switches are required for short-circuiting the PPs.

This equals to the number of combinations for selecting two PPs from four PPs.

This applies to PNs.

By transferring electric charges among the four systems from one to another, the charging and discharging currents on the data lines are reduced to about ¼ of the ones in the conventional device.

This applies to a device of more than the four systems.

Figure 7:
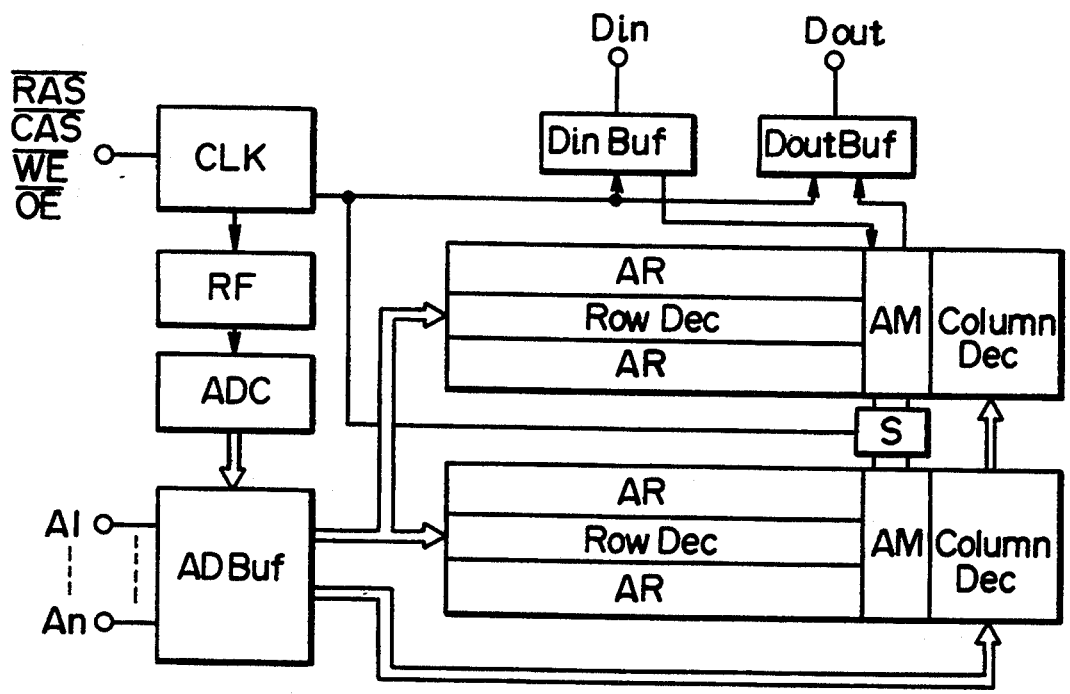
FIG. 7 shows a second layout.

FIG. 7 shows the structure of a DRAM using the present invention.

$\overline{RAS}$ denotes a start-up signal for an X system.

$\overline{CAS}$ denotes a start-up signal for a Y system.

$\overline{WE}$ denotes a selection signal which determines whether the write operation should be performed.

$\overline{OE}$ denotes a selection signal which determines whether a signal should be fed to the outside.

CLK denotes a buffer which receives those external signals and a circuit which generates various internal control signals on the basis of the external signals.

A1–An each denote an address signal and ADBuf denotes an address buffer.

AR denotes a memory cell array.

Row Dec denotes an X decoder and word driver.

Column Dec denotes an Y decoder and driver.

AM denotes a circuit, related to data lines, such as the sense amplifier, short circuit and read circuit.

Din Buf denotes an input buffer.

Dout Bur denotes an output buffer.

Din denotes an input terminal.

Dout denotes an output signal terminal.

S denotes a short circuit of the embodiments described so far and inherent to the present invention.

RF denotes a refreshment control circuit.

ADC denotes an address counter.

An example of the control circuit will be described next.

Figure 4:
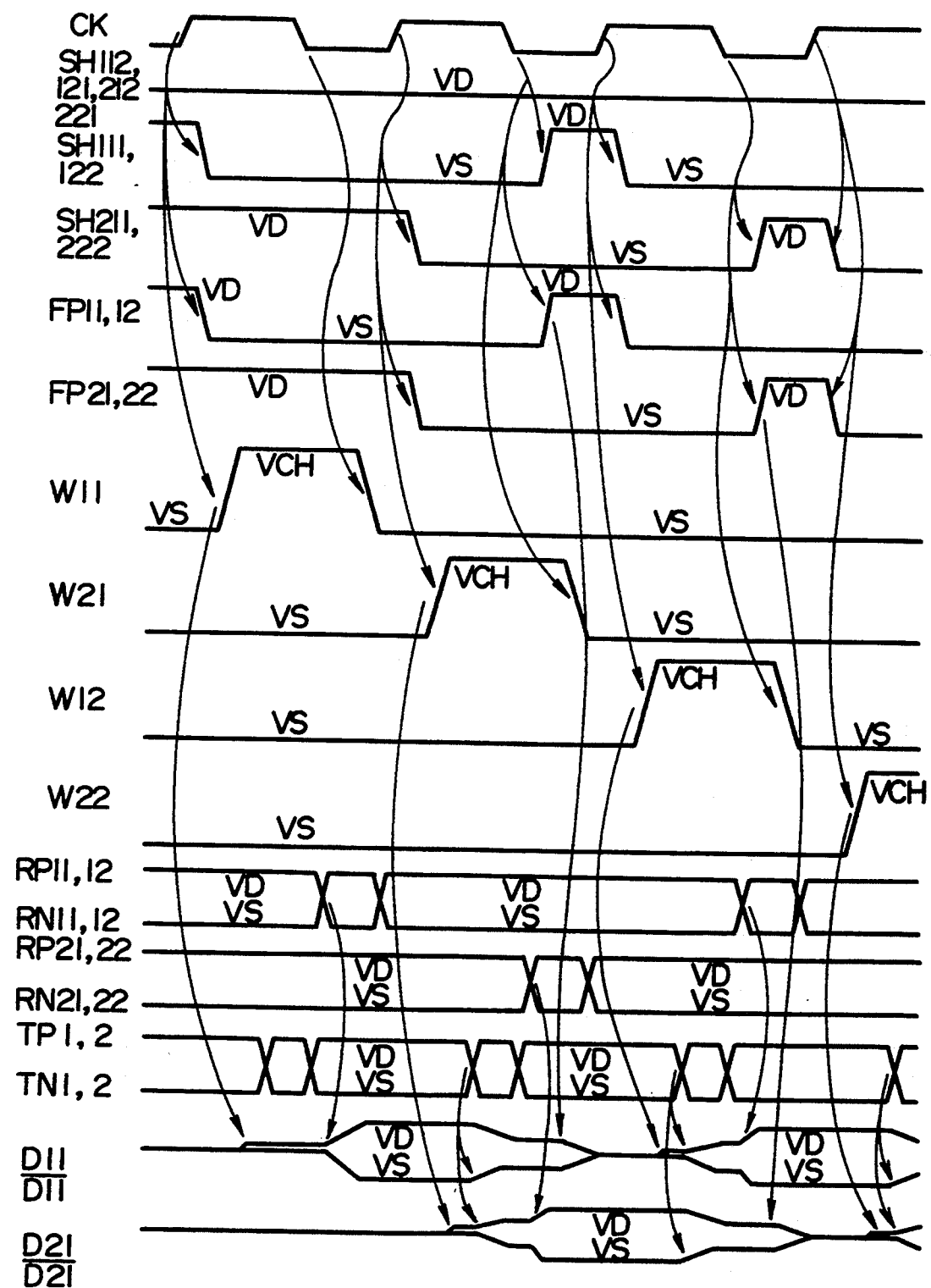
FIG. 4 illustrates the operation of the second embodiment.
Figure 14:
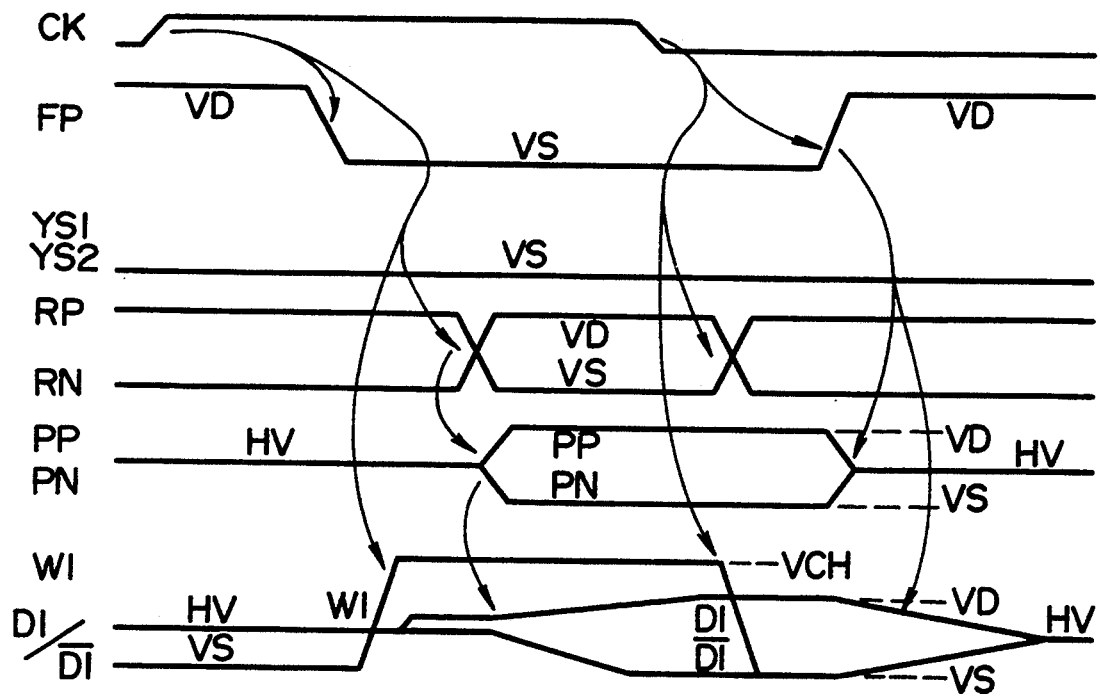
FIG. 14 illustrates the operation of the conventional example.

The difference between the inventive operation of FIG. 4 and the conventional operation of FIG. 14 is that according to the present invention, the FP11 or FP12 is maintained at low level from the time when the word line for one memory array AR11 is changed to low level VS to the time when the word line of the other memory array AR21 is selected.

In the conventional example of FIG. 14, immediately after the word line is changed to low level VS, the FP is changed to high level to thereby turn on the short circuit.

Figure 8:
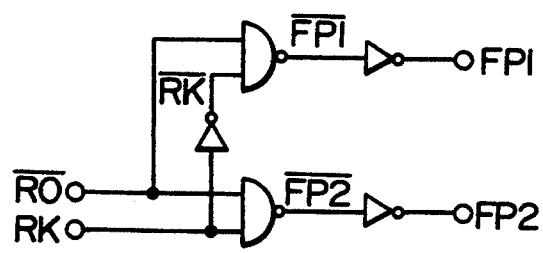
FIG. 8 shows a first illustrative control circuit.

An example of control circuit which generates pulses, used in the present invention, is illustrated in FIG. 8.

$\overline{RO}$ denotes a clock which operates in the same cycle as a selection cycle for the word line which is generated on the basis of the clock CK.

RK denotes a clock signal having a clock period which is twice the period of the clock of $\overline{RO}$.

Two NANDs each having two inputs are provided, where one NAND receives $\overline{RO}$ and RK while the other NAND receives $\overline{RO}$ and $\overline{RK}$ which is an inversion of RK.

The NANDs have outputs $\overline{FP1}$ and $\overline{FP2}$ the inversions of which are FP1 and FP2.

Figure 9:
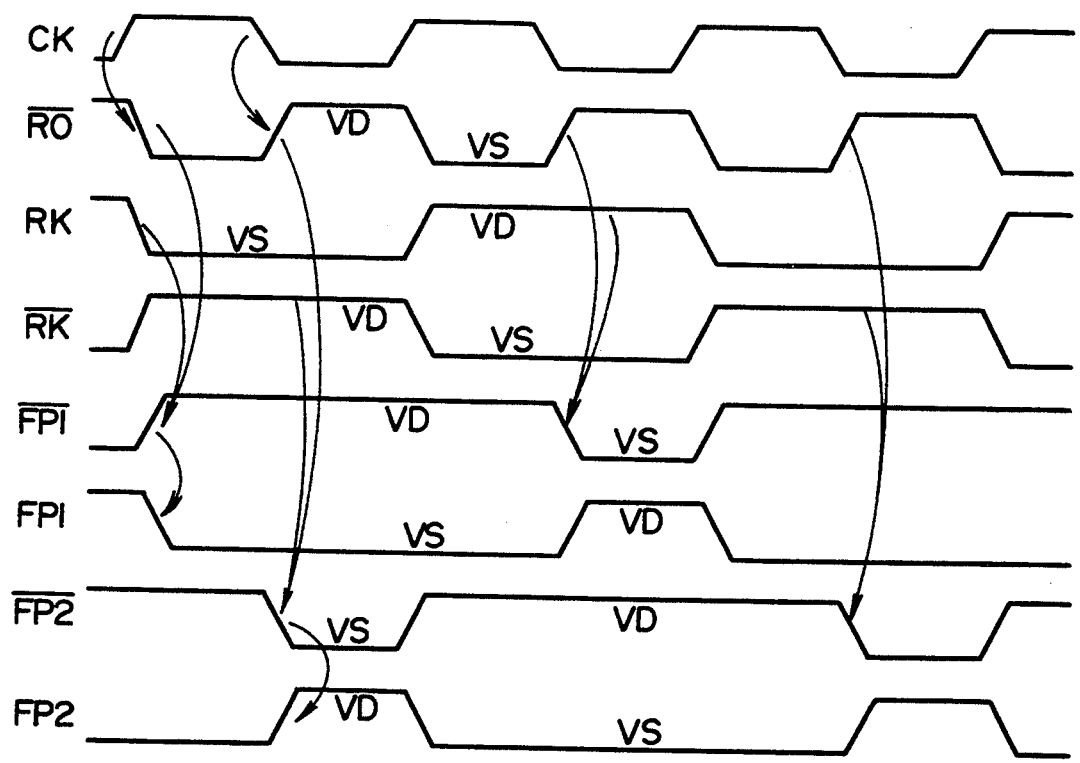
FIG. 9 illustrates the operation of the circuit of FIG. 8.

By using these signals, desired pulses are produced, as shown in FIG. 9.

Since the NAND having an output $\overline{FP1}$ receives $\overline{RO}$ and $\overline{RK}$, a $\overline{RO}$ pulse obtained when $\overline{RK}$ is at high level is inverted to produce $\overline{FP1}$, except which the NAND is at high level.

FP1 which is the inversion of $\overline{FP1}$ is the same signal as that shown in FIG. 4.

Similarly, the inversion of $\overline{RO}$ pulse when the RK is at high level appears at the $\overline{FP2}$.

The FP2 which is the inversion of $\overline{FP2}$ is slightly different from that shown in FIG. 4, and is VD initially in FIG. 4. which is not a problem and performs the same operation as that shown in FIG. 4.

FIG. 10 shows an address counter which is a second example of the control circuit used in the present invention.

ADC0–ADCj each denote a circuit ADC enclosed by a broken line.

In the ADC, INT denotes a signal which maintains this circuit ADC at low level when the ADC is not used and which changes output A to high level.

Ck denotes a clock signal. Ci and Cj denote an input and an output terminal used as a frequency divider by connecting the ADCs like an array of ADC0–ADCj.

The ADC itself is a circuit which outputs to A and Cj a signal obtained by halving the frequency of the clock Ck when the INT and Ci are at high level VD.

RM denotes a signal which determines whether this address counter should be operated.

R0 denotes a clock signal.

Figure 11:
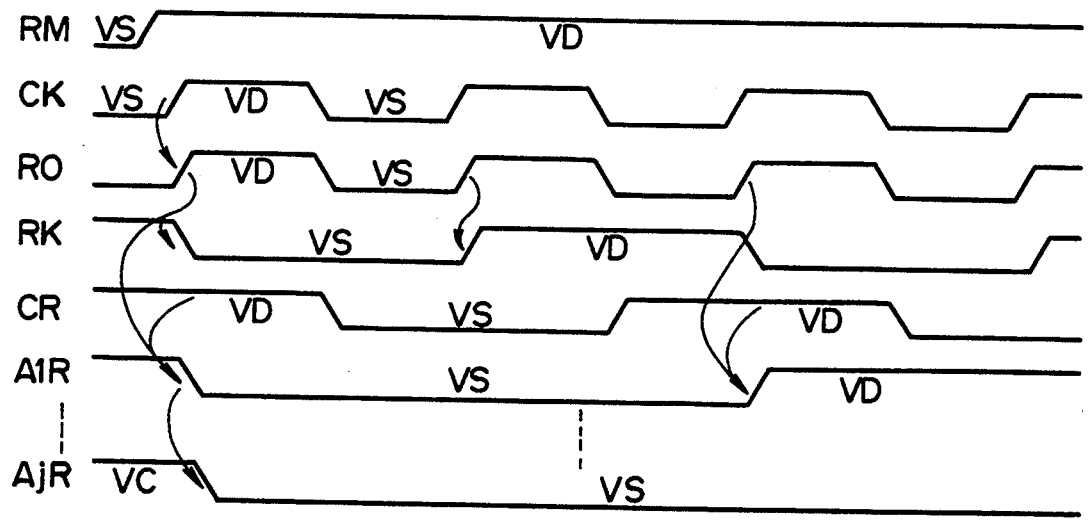
FIG. 11 illustrates the operation of the circuit of FIG. 10.

The operation of this address counter will be outlined with reference to FIG. 11.

First, the RM is initially at low level, so that the outputs RK and AiR and AjR of the ADC0-ADCj are all at high level VD.

When the RM changes to high level, the respective ADC circuits are enabled by the clock signal.

This causes the RK to halve R0 and AiR further divides this RK by 2, and so forth.

The use of the RK generates desired FP1 and FP2, as described with reference to FIGS. 8 and 9.

The decoder and driver are constructed such that the memory cells are appropriately selected by the other outputs A1R-AjR.

The RM is required to be generated on the basis of a combination of timings and levels of the signals $\overline{RAS}$, $\overline{CAS}$, $\overline{OE}$ and $\overline{WE}$.

In order to start an operational mode in the present invention, a system where a special-purpose pin is provided or a system which is switched after a lapse of a predetermined time in a so-called WCBR mode may be used.

While the refreshing operation to which the present invention is applied and which is performed when the DRAM is on standby has been described, the present invention is applicable similarly to the refreshing operation performed when a pseudo SRAM is on standby.

The present invention is also applicable to the read operation of a serial access memory such as an image memory in which the sequence of memory cell reading is predetermined.

Data to be read out is required beforehand written in order in a memory cell array where two PP and PN systems can be short-circuited.

The present invention is also applicable to a system where pairs of transistors are connected in parallel with corresponding single capacitors in a DRAM to perform a read operation and a refreshing operation in parallel, as disclosed in 1991 SYMPOSIUM ON VLSI CIRCUITS, Digest, pp. 65-66.

The present invention also appreciable to a system in which DRAM memory cells connected in series are read out sequentially, as disclosed in 1991 ISSCC, Digest, pp. 106-107.

The present invention can be applied to normal reading of a DRAM without changing the essence thereof.

Figure 12:
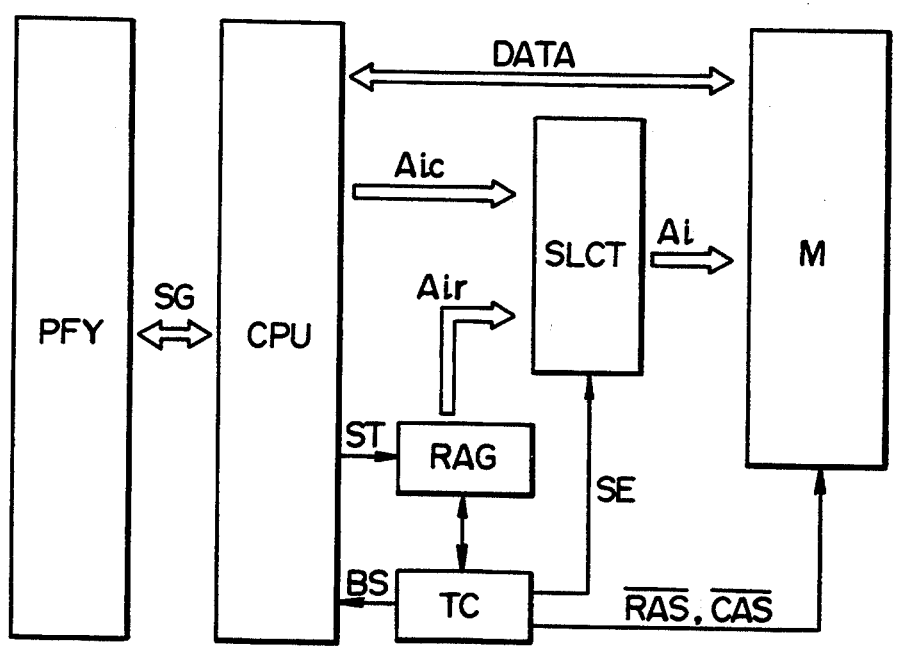
FIG. 12 shows a system structure to which the present invention is applied.

FIG. 12 shows a system structure in which the present invention is applied.

The arrows show the flow of signals.

A reference character M denotes a DRAM using the present invention.

CPU denotes a processor which controls the overall system.

RAG denotes a refreshed address generator.

TC denotes a control signal generator of a storage device using the present invention.

SLCT denotes a selector which selects one of an address signal from the CPU and a refreshed address signal from the RAG.

PFY denotes another device in the system.

PFY denotes, for example, an external storage device, display, numerical value calculating device, etc.

The PFY can be connected to another data processor through a communication line.

DATA denotes data transferred between the CPU and the M.

Aic denotes an address signal generated by the CPU.

Air denotes a refreshed address signal generated by the RAG.

Ai denotes an address signal selected by the SLCT and delivered to the M.

ST denotes a status signal delivered from the CPU to the RAG.

BS denotes a busy signal delivered from the TC to the CPU.

SE denotes a signal from the TC to start up the SLCT.

$\overline{RAS}$ and $\overline{CAS}$ denote signals which start up the DRAM using the present invention.

SG collectively represents the transfer of signals between the CPU and other units in the system.

The M may further include a dummy SRAM.

At this time, of course, there are used the corresponding start-up signals and control signals.

The use of a semiconductor device to which the present invention is applied halves the charge and discharge currents flowing through the data lines when refreshed on standby state compared to the conventional device.

Thus, the currents on the data lines are reduced when the memory array is on standby.

Therefore, a small standby current upon which the device may be drived by a battery is realized.

What is claimed is:

1. A semiconductor device comprising:
a first memory cell;
a first pair of data lines coupled to said first memory cell;
a first sense amplifier amplifying a signal read out onto said first pair of data lines from said first memory cell;
a second memory cell;
a second pair of data lines coupled to said second memory cell;
a second sense amplifier amplifying a signal read out onto said second pair of data lines from said second memory cell;
a first drive signal line for driving said first sense amplifier;
first switching means for coupling said first drive signal line with a first potential;
a second drive signal line for driving said second sense amplifier;
second switching means for coupling said second drive signal line with said first potential; and
third switching means provided between said first and second signal drive lines for coupling said first and second signal drive lines to each other.

2. A semiconductor storage device according to claim 1, wherein a word line for selecting said first memory cell differs from a word line for selecting said second memory cell.

3. A semiconductor storage device according to claim 1, wherein there is an overlapping interval where the interval in which said first switching means is off and the interval in which said second switching means is off overlap, and wherein the first and second drive signal lines are coupled by said third switching means during the overlap interval.

4. A semiconductor storage device according to claim 1, wherein after said first sense amplifier amplifies a signal read out onto said first pair of data lines from said first memory cell and turns off said first switching means, said third switching means temporarily couples said first and second drive signal lines and then decouples these signal lines from each other, and said second switching means is then turned on to cause said second amplifier to amplify the signal read out onto said second pair of data lines from said second memory cell.

5. A semiconductor storage device according to claim 4, wherein after the signal read out onto said second pair of data lines from said second memory cell is amplified, said second switching means is switched off, said third switching means temporarily couples said first and second drive signal lines and then decouples these signal lines from each other, and said first switching means is then turned on to cause said first amplifier to amplify a signal read out onto said first pair of data lines from said first memory cell.

6. A semiconductor storage device according to claim 5, wherein said first and second memory cells each comprise one transistor and one capacitor.

7. A semiconductor device comprising:
a first memory cell;
a first pair of data lines coupled to said first memory cell;
a first sense amplifier amplifying a signal read out onto said first pair of data lines from said first memory cell;
a second memory cell;
a second pair of data lines coupled to said second memory cell;
a second sense amplifier amplifying a signal read out onto said second pair of data lines from said second memory cell;
a first drive signal line for driving said first sense amplifier;
first switching means for coupling said first drive signal line with a first potential;
a second drive signal line for driving said second sense amplifier;
second switching means for coupling said second drive signal line with said first potential; and
a charge reuse circuit comprising third switching means provided between said first and second signal drive lines for coupling said first and second signal drive lines to each other at a predetermined time so that charges stored in the first drive signal line will flow into said second signal drive line to permit re-use of the charge stored on the first drive signal line.

8. A semiconductor storage device according to claim 7, wherein a word line for selecting said first memory cell differs from a word line for selecting said second memory cell.

9. A semiconductor storage device according to claim 7, wherein there is an overlapping interval where the interval in which said first switching means is off and the interval in which said second switching means is off overlap, and wherein the first and second drive signal lines are coupled by said third switching means during the overlap interval.

10. A semiconductor storage device according to claim 7, wherein after said first sense amplifier amplifies a signal read out onto said first pair of data lines from said first memory cell and turns off said first switching means, said third switch means temporarily couples said first and second drive signal lines and then decouples these signal lines from each other, and said second switching means is then turned on to cause said second amplifier to amplify the signal read out onto said second pair of data lines from said second memory cell.

11. A semiconductor storage device according to claim 9, wherein after the signal read out onto said second pair of data lines from said second memory cell is amplified, said second switching means is switched off, said third switching means temporarily couples said first and second drive signal lines and then decouples these signal lines from each other, and said first switching means is then turned on to cause said first amplifier to amplify a signal read out onto said first pair of data lines from said first memory cell.

12. A semiconductor storage device according to claim 11, wherein said first and second memory cells each comprise one transistor and one capacitor.

* * * * *